(12) United States Patent
Asahina et al.

(10) Patent No.: US 6,551,847 B2
(45) Date of Patent: Apr. 22, 2003

(54) INSPECTION ANALYZING APPARATUS AND SEMICONDUCTOR DEVICE

(75) Inventors: Kyoko Asahina, Tokyo (JP); Yoko Miyazaki, Tokyo (JP); Kaoru Yamana, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/955,081

(22) Filed: Sep. 19, 2001

(65) Prior Publication Data
US 2002/0081756 A1 Jun. 27, 2002

(30) Foreign Application Priority Data

Dec. 22, 2000 (JP) ........................ 2000-390098

(51) Int. Cl.[7] .............................................. G01R 31/26
(52) U.S. Cl. ....................................................... 438/18
(58) Field of Search ...................... 438/14, 18; 714/724; 382/145

(56) References Cited

U.S. PATENT DOCUMENTS 6,016,562 A   1/2000   Miyazaki et al.
6,178,257 B1 * 1/2001   Alumot .................. 382/145
6,367,040 B1 * 4/2002   Ott ......................... 714/724

FOREIGN PATENT DOCUMENTS

| JP | 6-275688  | 9/1994 |
| JP | 9-191032  | 7/1997 |
| JP | 9-199551  | 7/1997 |
| JP | 10-41203  | 2/1998 |
| JP | 10-107103 | 4/1998 |

* cited by examiner

Primary Examiner—John F. Niebling
Assistant Examiner—AndréC. Stevenson
(74) Attorney, Agent, or Firm—Oblon, Spivak, McClelland, Maier & Neustadt, P.C.

(57) ABSTRACT

A monitor wafer is processed by a processing apparatus, and thereafter, it is subjected to an inspection in a foreign object inspection apparatus in accordance with an inspection recipe. A measured result obtained by the inspection is compiled and analyzed in a data management system. Generally, a monitor wafer is not assigned a rot name or a wafer name, however, the measured result is assigned an identification name for identifying plural processing apparatuses from one another, and is stored in a database as storage data.

16 Claims, 15 Drawing Sheets

8

9

10

F I G. 7
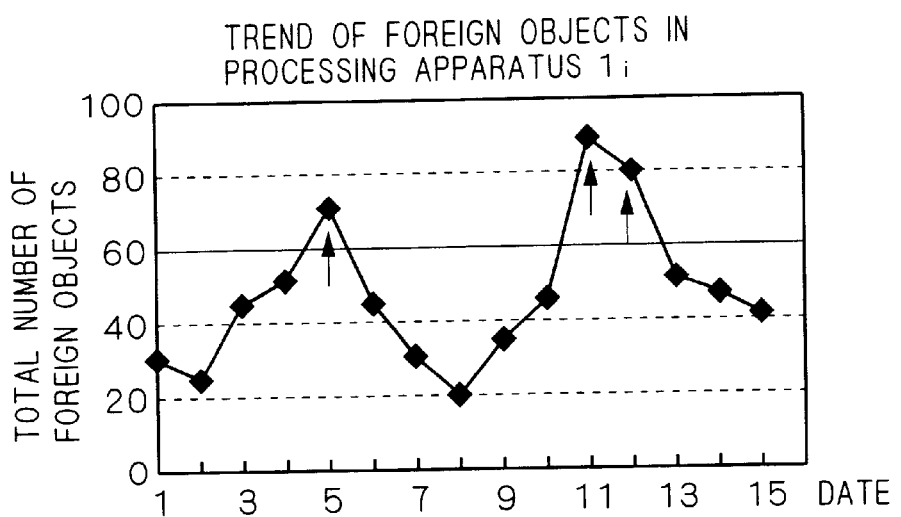

13

16

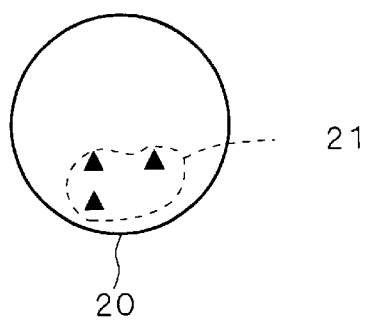
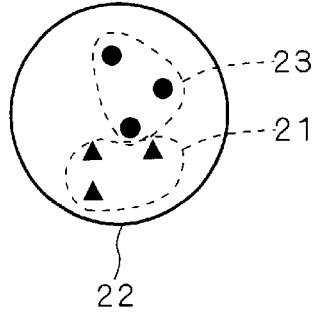
FIG. 19A  FIG. 19B
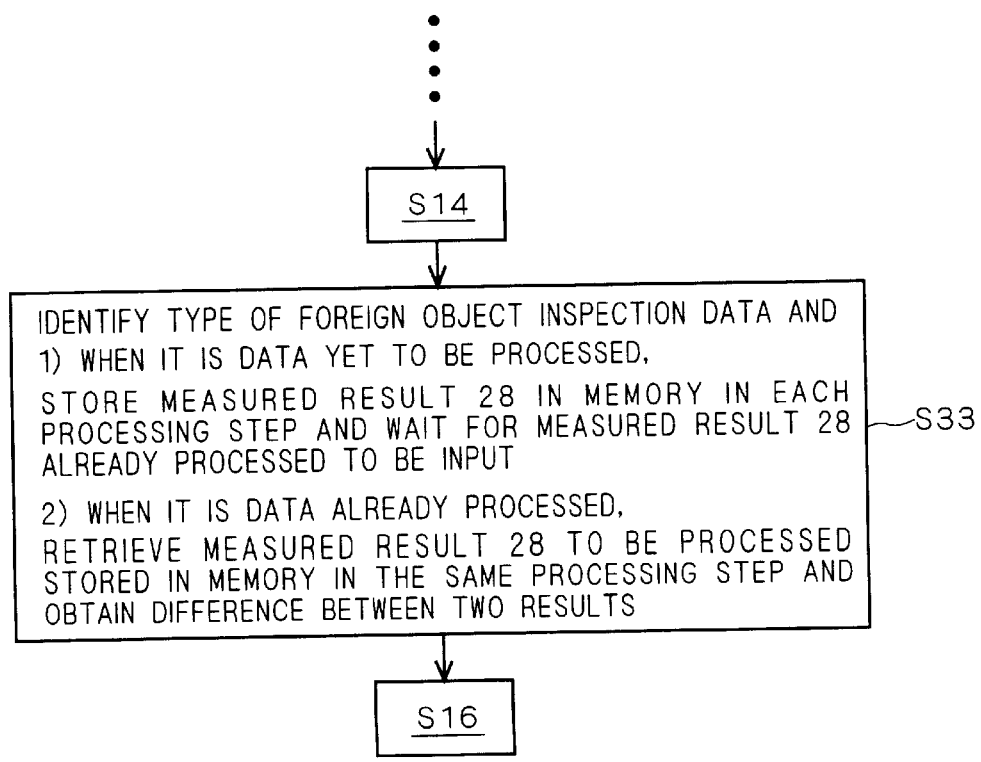
FIG. 20

INSPECTION ANALYZING APPARATUS AND SEMICONDUCTOR DEVICE

BACKGROUND OF THE INVENTION

1. Field of the Invention

The present invention is applicable to, for example, the field of analyzing technique for a processing apparatus to be used for manufacturing a semiconductor device.

2. Description of the Background Art

A plurality of processing steps are executed in manufacturing steps of a semiconductor device or the like, and a plurality of processing apparatuses are employed for executing the processing steps. Therefore, to grasp and control the performance of the plurality of processing apparatuses is one of effective methods for improving the quality of a semiconductor device. For instance, foreign objects are grasped in the inside of each processing apparatus. In this way, one or more wafers are used for controlling foreign objects in each processing apparatus, commonly called as monitor wafer, which are provided only for a single processing step.

FIG. 23 is a schematic view of conventional foreign object controlling steps. One or more monitor wafers $W_1$ to $W_N$ is/are used in processing apparatuses $1_1$ to $1_N$, respectively, each performing a process on a wafer to be product (referred to as "product wafer" in the present specification; not shown). These monitor wafers $W_1$ to $W_N$ undergo predetermined processing steps in the processing apparatuses $1_1$ to $1_N$, respectively, and thereafter, are subjected to a predetermined inspection, e.g., counting of the number of foreign objects, in a foreign object inspection apparatus 2.

A measured result 28 which is an inspection result of the foreign object inspection apparatus 2, e.g., the number of foreign objects counted in each of the monitor wafers $W_1$ to $W_N$, is written on reports $29_1$ to $29_N$ by an operator for each of the monitor wafers $W_1$ to $W_N$ and stored in a file 30 at once.

However, the monitor wafers $W_1$ to $W_N$ generally have no rot names or wafer names assigned. Neither are they provided, in general, with names nor information that can identify an apparatus where they have been processed. In some cases, information on a foreign object inspection for a monitor wafer is treated as an ad hoc number, in which there is performed neither identification of each wafer nor data collection (storage) with a processing apparatus and a wafer itself associated with each other. Hence, the measured result 28 written on each of the reports $29_1$ to $29_N$ is merely ad hoc information. Therefore, it is difficult to analyze data on a specific processing apparatus over a long period of time. Further, it is difficult to perform identification afterwards as to which inspection data represents data of which wafer and data of which processing apparatus taking account of information on distributions of foreign objects on a wafer map as well. Furthermore, it is impossible to make a comparison and analysis between the data and a product wafer processed in the specific processing apparatus.

SUMMARY OF THE INVENTION

According to a first aspect of the present invention, an inspection analyzing method comprises the steps of: providing one or more monitor wafers for each of a plurality of processing steps individually performed by a plurality of processing apparatuses; performing an inspection on the one or more monitor wafers to obtain an inspection result; and assigning the inspection result an identification name for identifying each of the plurality of processing apparatuses having performed the plurality of processing steps in the step (a) on the one or more monitor wafers subjected to the inspection by which the inspection result is obtained, and storing the inspection result.

According to a second aspect of the present invention, the inspection analyzing method of the first aspect further comprises the step of (d) compiling and analyzing the inspection result stored in the step (c).

According to a third aspect of the present invention, in the inspection analyzing method of the first aspect, the step (b) includes the step of (b-1) issuing an alarm when the inspection result falls outside a predetermined allowable range.

According to, a fourth aspect of the present invention, the inspection analyzing method of the third aspect further comprises the step of (e) comparing the inspection result stored in the step (c) for a processing apparatus among the plurality of processing apparatuses in which an alarm has been issued in the step (b-1) with a defect distribution of a product wafer which has undergone the plurality of processing steps executed by the plurality of processing apparatuses.

According to a fifth aspect of the present invention, the inspection analyzing method of the first or second aspect further comprises the step of (e) comparing the inspection result stored in the step (c) with a defect distribution of a product wafer which has undergone the plurality of processing steps executed by the plurality of processing apparatuses.

According to a sixth aspect of the present invention, in the inspection analyzing method of the first or second aspect, the plurality of processing apparatuses execute the same processing steps.

According to a seventh aspect of the present invention, in the inspection analyzing method of the first or second aspect, a plurality of inspection recipes are employed in the step (b) to obtain the inspection result by each of the plurality of inspection recipes.

According to an eighth aspect of the present invention, in the inspection analyzing method of the first or second aspect, the step (b) includes the steps of: (b-1) performing the inspection before and after processes of the plurality of processing steps, respectively; and (b-2) obtaining, as the inspection result, a difference in the inspection performed before and after the processes of the plurality of processing steps, respectively.

According to a ninth aspect of the present invention, in the inspection analyzing method of the eighth aspect, in the step (b-2), the inspection result is obtained as a difference between data on the inspection obtained before the processes and that obtained after the processes, considering position coordinates of the one or more monitor wafers.

According to a tenth aspect of the present invention, in the inspection analyzing method of the first or second aspect, in the step (c), the inspection result is provided with a comment indicating the condition of a processing apparatus among the plurality of processing apparatuses that corresponds to the inspection result.

According to an eleventh aspect of the present invention, an inspection analyzing method comprises the steps of: (a) performing a plurality of inspections on a wafer to be processed in a first processing step which is executed by a first processing apparatus; (b) performing an inspection on a wafer to be processed in the first processing step and a second processing step which is executed after the first processing step; and (c) comparing a plurality of inspection results obtained by the step (a) with an inspection result obtained by the step (b).

According to a twelfth aspect of the present invention, the inspection analyzing method of the eleventh aspect further comprises the step of (d) compiling and analyzing the inspection results stored in the step (c).

According to a thirteenth aspect of the present invention, in the inspection analyzing method of any one of the first to twelfth aspects, the inspection results stored in the step (c) are converted into a file that corresponds to a browser and transmitted.

According to a fourteenth aspect of the present invention, in the inspection analyzing method of any one of the first to twelfth aspects, the inspection results stored in the step (c) are converted into a file that corresponds to a browser and transmitted.

According to a fifteenth aspect of the present invention, in the inspection analyzing method of any one of the first to fourteenth aspects, the inspection results stored in the step (c) can be delivered on a network.

With the inspection analyzing method of the first, second, thirteenth and fourteenth aspects of the present invention, desired foreign objects in a desired processing apparatus is easily grasped, processed and analyzed even when a monitor wafer generally having no rot name or wafer name is used.

With the inspection analyzing method of the third aspect of the present invention, abnormality of a processing apparatus becomes known immediately after a measured result is obtained.

With the inspection analyzing method of the fourth aspect of the present invention, it is possible to know in what range a product wafer is affected by a processing apparatus where an alarm has been issued.

With the inspection analyzing method of the fifth aspect of the present invention, a processing apparatus causing a defect generated in a product wafer is easily specified.

The inspection analyzing method of the sixth aspect of the present invention makes an analysis as to whether or not an inspection result is common to processing steps executed by apparatuses of the same model which are under consideration, whether or not the apparatuses of the same model each have a specific cause of the inspection result, and the like.

With the inspection analyzing method of the seventh aspect of the present invention, inspection recipes are optimized, which further contributes to settings of specifications corresponding to the inspection recipes.

The inspection analyzing method of the tenth aspect of the present invention contributes to an analysis of the relation between the condition of a processing apparatus and a cause of occurrence of foreign objects due to the processing apparatus, e.g., occurrence of dust.

The inspection analyzing method of the eighth, ninth, eleventh and twelfth aspects of the present invention facilitates a grasp of an inspection result such as an increase in the number of foreign objects with more reliability.

According to the semiconductor device of the fifteenth aspect of the present invention, a semiconductor device manufactured effectively is obtained.

In the present invention, it is preferable to additionally provide a monitor wafer with a name that can identify a processing apparatus where the monitor wafer has been processed. This facilitates identification from which processing apparatus data comes taking account of information on distributions of foreign objects on a wafer map as well. A wafer designed specifically for monitoring may be employed as the monitor wafer according to the present invention, whereas a product wafer may be specified as a monitor wafer in the midstream of processing or may be previously specified as such. Taking a product wafer as a monitor wafer from the midstream of processing may allow saving of the labor of introducing an extra wafer, resulting in cost reduction. On the other hand, use of a wafer specifically designed for monitoring allows inspection conditions to be set more freely, so that severe management is advantageously exercised.

The present invention is directed to realize an analysis of inspection results obtained over a long period of time cannot be made sufficiently with conventional management using the file 30.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a trend graph exemplifying execution results of the second embodiment;

FIGS. 19A and 19B are maps exemplifying execution results of the seventh embodiment;

FIG. 20 is a flow chart showing part of steps according to an eighth embodiment of the invention;

DESCRIPTION OF THE PREFERRED EMBODIMENTS

First Preferred Embodiment

Figure 1:
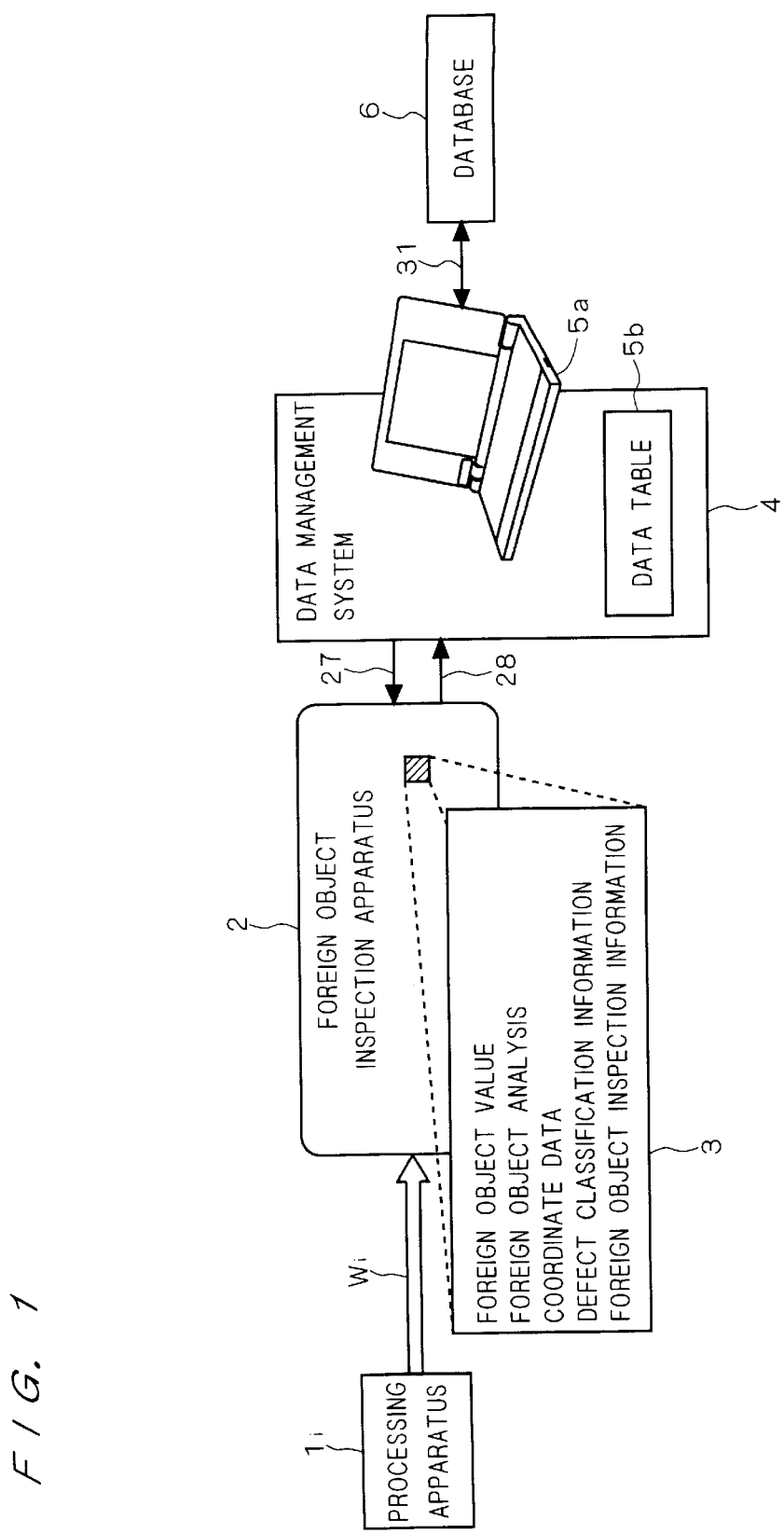
FIG. 1 is a schematic view of a structure according to a first embodiment of the invention.
Figure 2:
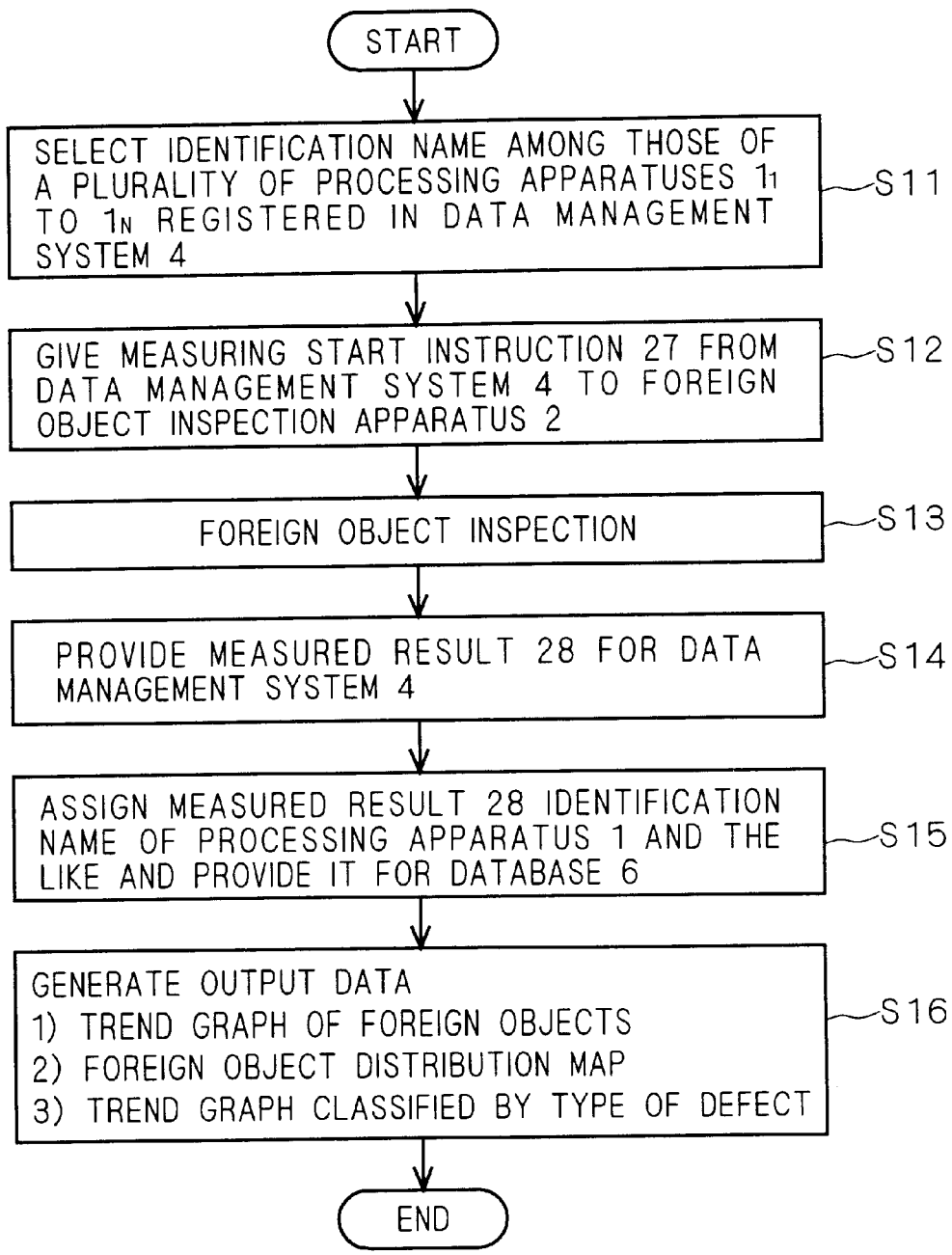
FIG. 2 is a flow chart briefly showing steps of the first embodiment.

FIG. 1 is a schematic view of a structure used for foreign object analysis according to a first embodiment of the present invention. FIG. 2 is a flow chart briefly showing steps of the foreign object analysis.

One or more monitor wafers $W_i$ (hereinafter generally referred to as "monitor wafer/wafers W" as well) are provided separately for a process individually conducted by a processing apparatus $1_i$ ($1 \leq i \leq N$, $2 \geq N$: hereinafter generally referred to as "processing apparatus 1" as well). One or more monitor wafers $W_i$ are fed to the foreign object inspection apparatus 2 to be subjected to foreign object inspection. In the drawing, one or more monitor wafers $W_i$ are moved as indicated by the hollow arrow, and other information is transmitted as indicated by the normal arrows.

A data management system 4 is achieved by executing a predetermined program in a personal computer 5a, for example. The data management system 4 comprises a data table 5b.

Names for identifying processing apparatuses $1_1$ to $1_N$ from each other (identification names of the processing apparatuses $1_1$ to $1_N$) are previously registered in the data table 5b in the data management system 4. First, one of the identification names of the processing apparatuses is selected in step S11. In the case that there are plural processing apparatuses that perform the same processing steps (hereinafter referred to as "apparatuses of the same model" as well), those apparatuses cannot be identified merely by using the names of the processing apparatuses as the identification names. Thus, the names of processing apparatuses are previously registered in the data management system 4 in combination with names of groups to which the processing apparatuses belong to (group names), and one of them is selected in step S11.

Proceeding into step S12, the data management system 4 provides a measuring start instruction 27 for the foreign object inspection apparatus 2 so as to perform foreign object inspection using an inspection recipe 3 corresponding to a selected processing apparatus 1. The inspection recipe 3 may be previously stored in the foreign object inspection apparatus 2 as shown in FIG. 1 and may be selected by the measuring start instruction 27. Alternatively, the measuring start instruction 27 may include the inspection recipe 3.

Proceeding into step S13, the foreign object inspection apparatus 2 performs foreign object inspection on the monitor wafer W, and proceeding into step S14, the measured result 28 containing information about the foreign object inspection is given to the data management system 4.

Proceeding into step S15, the data management system 4 assigns the measured result 28 the identification name of the processing apparatus 1 together with, for example, an inspection recipe's name for specifying the inspection recipe 3 and inspection time data for specifying an inspection time, thereby generating storage data 31 and gives it to a database 6. Proceeding into step S16, the data management system 4 generates output data which is necessary for display. For generating the data, the storage data 31 previously stored in the database 6 is read out, compiled and analyzed. The database 6 is shown outside the data management system 4 in FIG. 1, however, it may be provided in the personal computer 5a or in a storage apparatus connected thereto and may be present inside the data management system 4.

Figure 3:
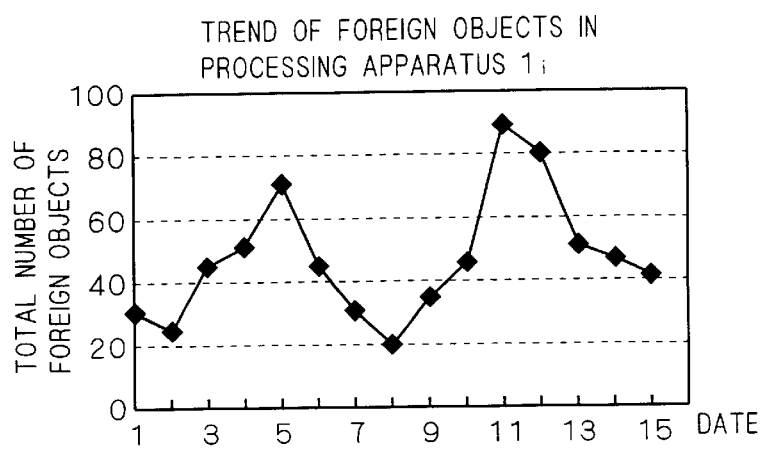
FIG. 3 is a trend graph exemplifying execution results of the first embodiment.
Figure 4A:
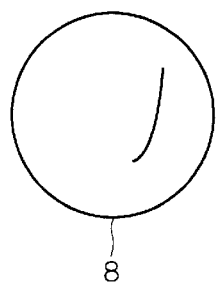
FIGS. 4A to 4C are foreign object distribution maps exemplifying execution results of the first embodiment.
Figure 4B:
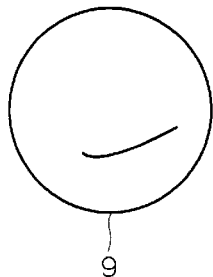
Figure 4C:
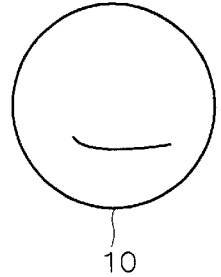
Figure 5:
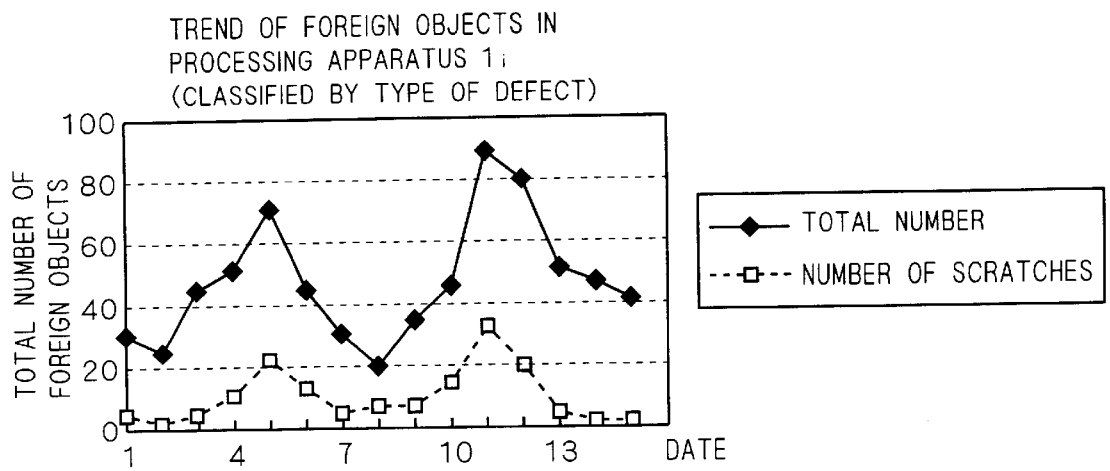
FIG. 5 shows trend graphs exemplifying execution results of the first embodiment.

FIG. 2 exemplifies, as the output data, a trend graph of foreign objects, distribution maps and trend graphs classified by types of defects. FIGS. 3 to 5 correspond to these exemplifications.

FIG. 3 is a trend graph of foreign objects in which changes over time in the total number of foreign objects are traced and plotted in a specific processing apparatus $1_i$. FIGS. 4A to 4C are foreign object distribution maps 8, 9 and 10, respectively, showing distributions of foreign objects generated in different monitor wafers W when subjected to processing steps executed by the same processing apparatus $1_i$. FIG. 5 are graphs in which the number of a specific type of foreign objects, i.e., the number of scratches in the present description, is additionally plotted in the graph shown in FIG. 3. These graphs and maps may be displayed on the personal computer 5a, or a data display apparatus may be provided separately. These graphs and maps may be converted into a file format corresponding to a browser software, thereby transmitting file data to store it in a specific folder, or delivering it to a file on a network via e-mail.

As has been described, the foreign object inspection is performed using the monitor wafers W, and the storage data 31 is generated with respect to the result of the inspection and stored in the database 6. The stored data is compiled to perform foreign object analysis. In the present invention, employment of an identification name of a processing apparatus 1 subjected to the foreign object inspection when generating the storage data 31 allows an easy grasp, processing and analysis of foreign objects in a desired processing apparatus 1 at a desired timing over a long period of time even with a monitor wafer W usually having no rot name or wafer name assigned. In this analysis, the condition of foreign objects in early stages in a wafer to be supplied to a processing apparatus is inspected as a pre-introduction measurement and is stored as an initial value in the database, and foreign object inspection data after being processed in the processing apparatus is differentiated taking position coordinates into consideration, the result of which is handled as data on increased foreign objects.

As shown in FIGS. 3 and 5, for example, a trend of foreign objects in an apparatus over an arbitrary period of time can be analyzed. Moreover, the plurality of maps shown in FIGS. 4A to 4C are compared to confirm that foreign objects have the same distribution, which allows a clear grasp that a processing apparatus 1 corresponding to the maps contains a defect position. Of course, an analysis is easily applicable to the present application that is similar to a conventional analysis where a plurality of processing steps are carried out on a wafer to be a product.

Further, even when there are a plurality of processing apparatuses 1 performing the same processing steps, those apparatuses can be identified from each other by identification names, achieving a grasp of differences among processing apparatuses performing the same processing steps (difference in model and presence or absence of a deficiency).

In the present invention not limited to the present embodiment but also including preferred embodiments to be described later, an analysis may be performed not only on foreign objects but also on film thickness data. In that case, an inspection apparatus shall be employed which has the function of inspecting film thickness instead of the foreign object inspection apparatus. This, for example, makes it possible to analyze data on a film thickness distribution in a film forming apparatus and data on an etching speed distribution in an etching apparatus.

Second Preferred Embodiment

Figure 6:
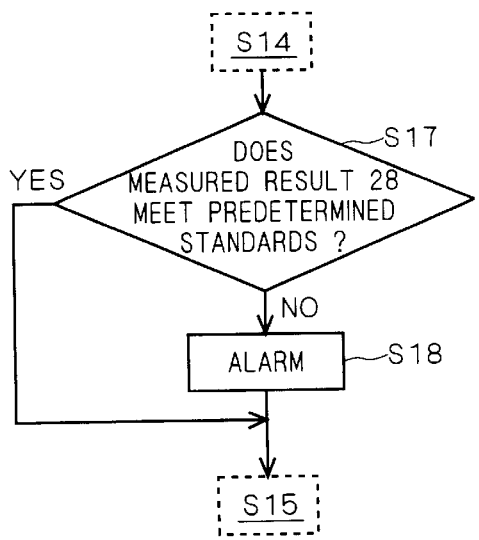
FIG. 6 is a flow chart showing part of steps according to a second embodiment of the invention.

FIG. 6 is a flow chart showing part of foreign object analyzing steps according to the present embodiment. In step S17, it is judged whether or not the measured result 28 obtained by step S14 as in the first embodiment meets predetermined standards, e.g., whether or not the result exceeds an allowable number of foreign objects. The predetermined standards are previously set in the data management system 4. Based upon the trend of foreign objects shown in FIG. 3, the allowable total number of foreign objects is 60.

When the predetermined standards are met, the step branches to YES and proceeds into step S15, where the measured result 28 is stored in the database 6 as in the first embodiment. When the predetermined standards are not met, the step branches to NO and proceeds into step S18, where an alarm process is performed.

As the alarm process, it is sufficient to merely display "NG", for example, to attract the attention of an operator. The operator thereby becomes aware of abnormality of the processing apparatus 1 immediately after the measured result 28 is obtained. When it is judged "YES" in step S17, a display "OK" may be produced before proceeding into step S15. Such a display may be produced in the personal computer 5a, or a data display apparatus may be provided separately.

In the case that step S18 is executed, the foreign object analyzing steps may be interrupted, while it is also preferable to proceed further into step S15. At this time, the measured result 28 is given to the database 6 with the identification name of the processing apparatus 1, etc. together with information indicating the issuance of an alarm. FIG. 7 is a trend graph obtained in the present embodiment. As shown in FIG. 7 with arrows, the issuance of an alarm on fifth, eleventh and twelfth days may be displayed in the trend of foreign objects.

Third Preferred Embodiment

A comparison between the above-described analysis in the present invention and other analyzed information such as analyzed information on a product wafer, enables to specify a process which causes a defect in the product wafer.

Figure 8:
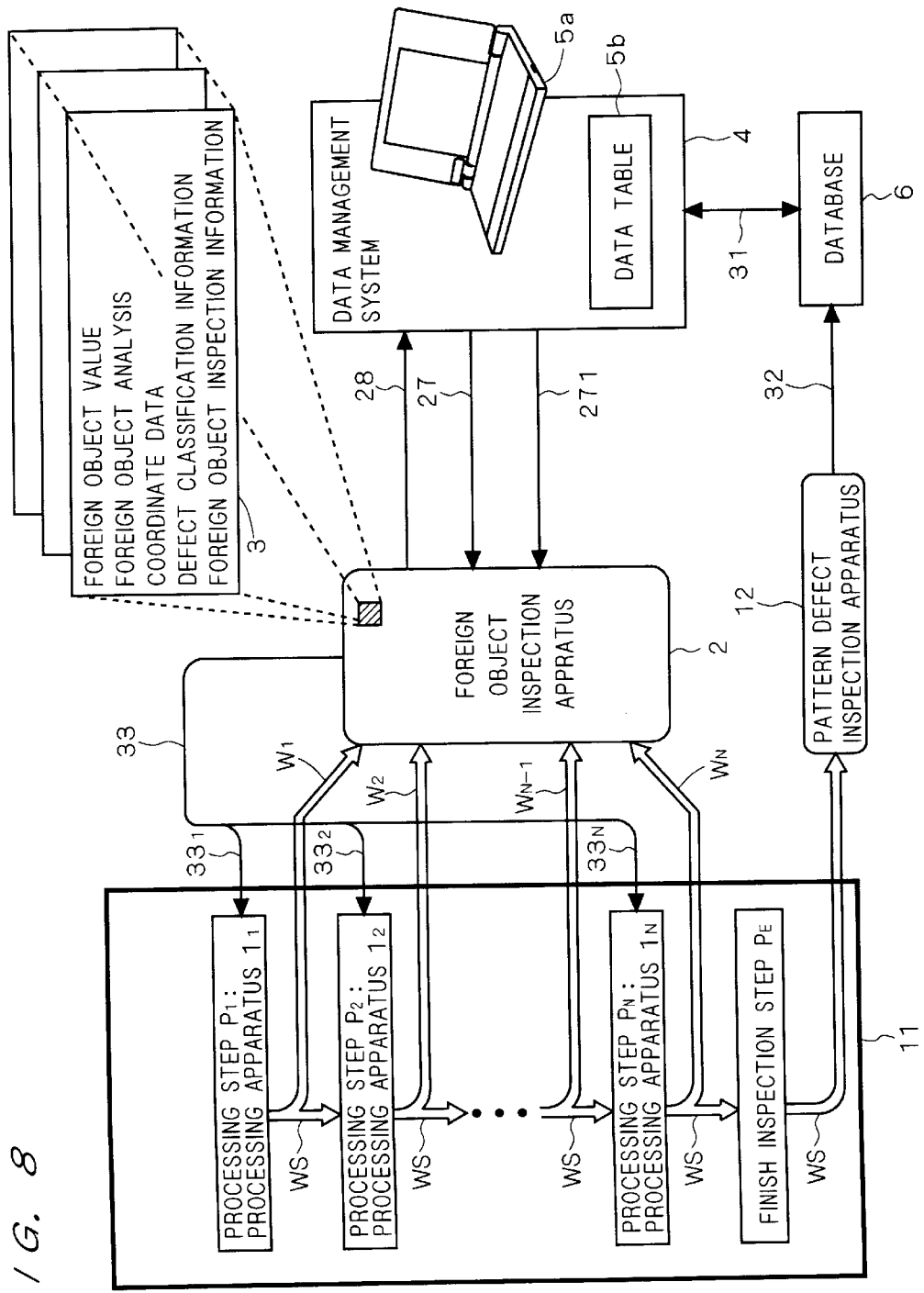
FIG. 8 is a schematic view of a structure according to a third embodiment of the invention.
Figure 9:
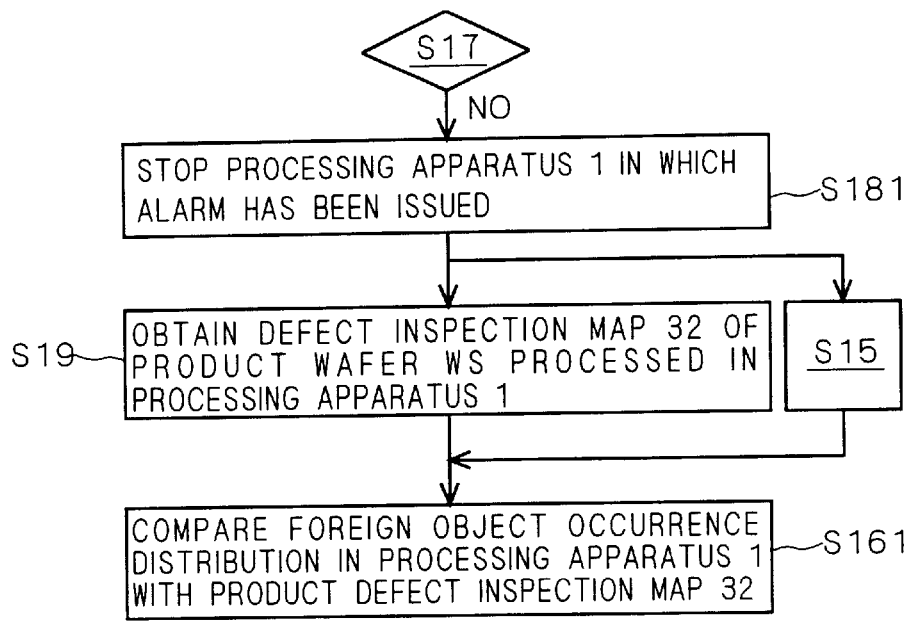
FIG. 9 is a flow chart showing part of steps according to the third embodiment.

FIG. 8 is a schematic view of a structure used for the foreign object analysis according to the present embodiment. FIG. 9 is a flow chart showing part of the foreign object analyzing steps. In a processing step group 11 shown in FIG. 8, a product wafer WS is subjected to processing steps $P_1$ to $P_N$ performed by the processing apparatuses $1_1$ to $1_N$, in this order. On the other hand, a monitor wafer $W_i$ is also subjected to each processing step $P_i$. The product wafer WS and the monitor wafer $W_i$ do not need to be processed by the processing step $P_i$ at the same time. In the drawing, the monitor wafer $W_i$ and the product wafer WS are moved as indicated by the hollow arrows, and other information is transmitted as indicated by normal arrows.

As described in the first preferred embodiment, one or more monitor wafers $W_i$ are subjected to the foreign object inspection based on the inspection recipe 3 in the foreign object inspection apparatus 2. The inspection recipe 3 may be provided separately for each of the processing steps $P_1$ to $P_N$. The case shown here is that a plurality of inspection recipes 3 are stored in the foreign object inspection apparatus 2, whereas an individual inspection recipe 3 may be included in the measuring start instruction 27 as described in the first embodiment. As shown in the first embodiment, the measured result 28 obtained by the foreign object inspection apparatus 2 is transmitted to the data management system 4 to generate the storage data 31 with an identification name, etc., assigned, which is stored in the database 6.

As shown in the second embodiment, an alarm is issued when the measured result 28 falls outside a predetermined allowable range. The issuance of an alarm is indicated by an alarm issuance information 271 in FIG. 8. As shown in FIG. 6, for example, the alarm process is executed in step S18.

Step S181 shown in FIG. 9 shows part of the function of step S18. In step S181, the foreign object inspection apparatus 2 provides a processing apparatus $1_A$ with a stop instruction $33_A$ (hereinafter generally referred to as "stop instruction 33" as well) so as to stop a processing step $P_A$ ($1 \leq A \leq N$, $N \geq 2$) in which an alarm has been issued.

After step S18 (including step S181) is completed, the storage data 31 for a monitor wafer $W_A$ is stored in the database 6 by step S15 similarly to other monitor wafers $W_i$, while step S19 is executed.

Obtained in step S19 is information on a defect of the product wafer WS which has been processed in the processing apparatus $1_A$ stopped by the issuance of an alarm. This step is to be executed for the product wafer WS which has undergone processing steps $1_{A+1}$–$A_N$ (a case where A=N is not included) subsequent to the processing step $1_A$ and a finish inspection step $P_E$. For instance, the product wafer WS is subjected to pattern defect inspection in a pattern defect inspection apparatus 12, and a defect inspection map 32 is stored in the database 6.

In general, the product wafer WS is individually assigned a rot name and a wafer name which are, for example, stamped thereon, and thus the rot name and the wafer name can be added to the defect inspection map 32 for storing. As shown in the first embodiment, the identification names, etc. are also added in the storage data 31 obtained by step S15. Therefore, proceeding into step S161 (FIG. 9), a comparison can be made between the defect inspection map of the product wafer WS which has been processed in the processing apparatus $1_A$ under the condition in which an alarm has been issued and a map showing the result of the foreign object inspection on the monitor wafer $W_A$ which has been used in the processing apparatus $1_A$ Step S161 can be taken as generation of 2) foreign object distribution map, which is part of step S16 shown in FIG. 2.

The above comparison allows judgement as to whether or not a characteristic distribution of foreign objects obtained by the foreign object inspection in the processing apparatus 1 conforms with a defect generated in the product wafer WS. If yes, the processing apparatus $1_A$ in which an alarm has been issued can be considered to be the cause of the defect generated in the product wafer WS. In other words, it is possible to know the product wafer WS suffering from occurrence of a defect, etc. due to the processing apparatus $1_A$ in which an alarm has been issued and to specify a damaged rot. Specifying the rot is executed by a comparison of maps, which can be carried out with high accuracy.

Figure 10A:
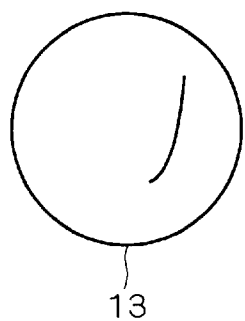
FIGS. 10A and 10B are maps exemplifying execution results of the third embodiment.
Figure 10B:
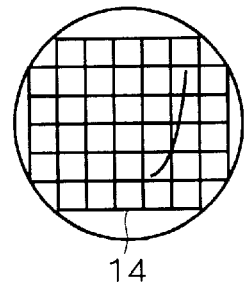

FIGS. 10A and 10B are maps schematically showing the above comparison and indicating a foreign object distribution map 13 and a pattern defect inspection map 14, respectively. A lattice pattern in FIG. 10B schematically indicates a form of chips to be cut out from the product wafer. The case shown here is that the form of a foreign object distribution conforms with that of a defect distribution.

Figure 11:
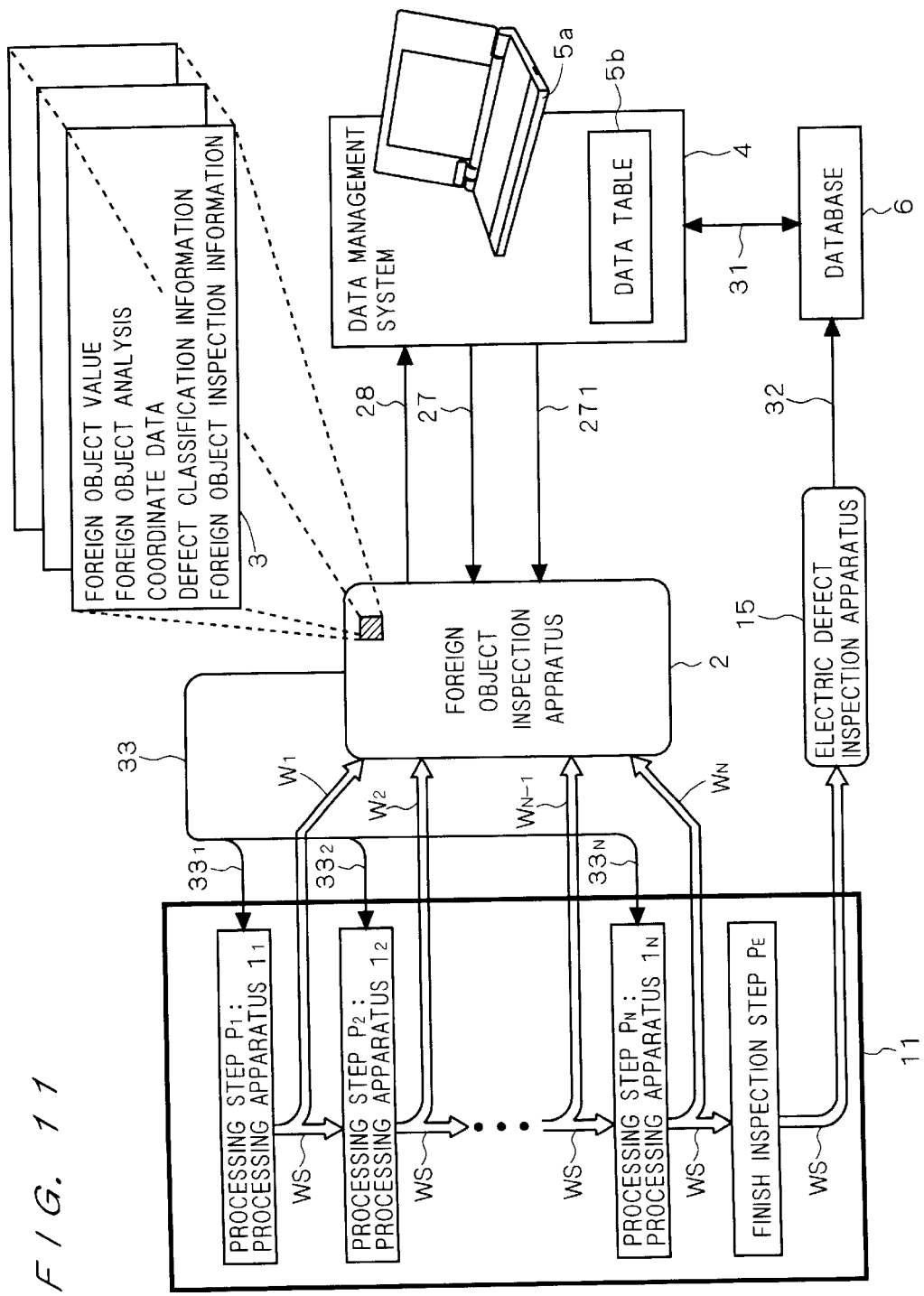
FIG. 11 is a schematic view of a modification of the third embodiment.
Figure 12A:
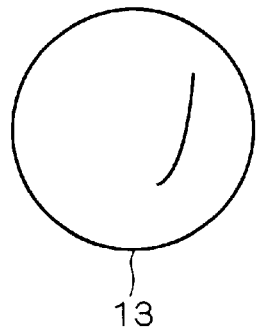
FIGS. 12A and 12B are maps exemplifying execution results of the modification of the third embodiment.
Figure 12B:
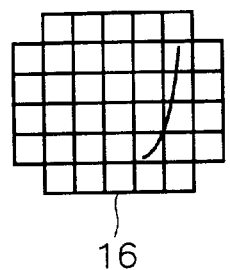

The inspection result of the product wafer WS except the defect inspection result can be compared with the foreign object distribution. FIG. 11 is a schematic view of a modification of the third embodiment which characteristically differs from the structure shown in FIG. 8 in that the pattern defect inspection apparatus 12 is replaced by an electric defect inspection apparatus 15. The electric defect inspection apparatus 15 performs defect inspection on electric characteristics such as insulation properties, and provides the result of the inspection for the database 6 as the defect inspection map 32. FIGS. 12A and 12B are maps schematically showing the foreign object distribution map 13 and an electric defect inspection map 16, respectively. A lattice pattern in FIG. 12B schematically indicates a form of chips to be cut out from the product wafer. The case shown here is that the form of the foreign object distribution conforms with that of the defect distribution.

The occurrence of such an electric defect is critical to chips to be cut out from the product wafer, so that it is possible to estimate manufacturing yields based on the foreign object distribution.

The alarm process in step S18 does not necessarily require the stopping process shown in step S181, and the above comparison will not be obstructed by continuation of the operation of the processing apparatus $1_A$.

Fourth Preferred Embodiment

The defect inspection map 32 (FIG. 8) may be compared with the storage data 31 not only with respect to the processing apparatus $1_A$ in which an alarm has been issued but also with respect to all the processing apparatuses $1_1$ to $1_N$.

Figure 13:
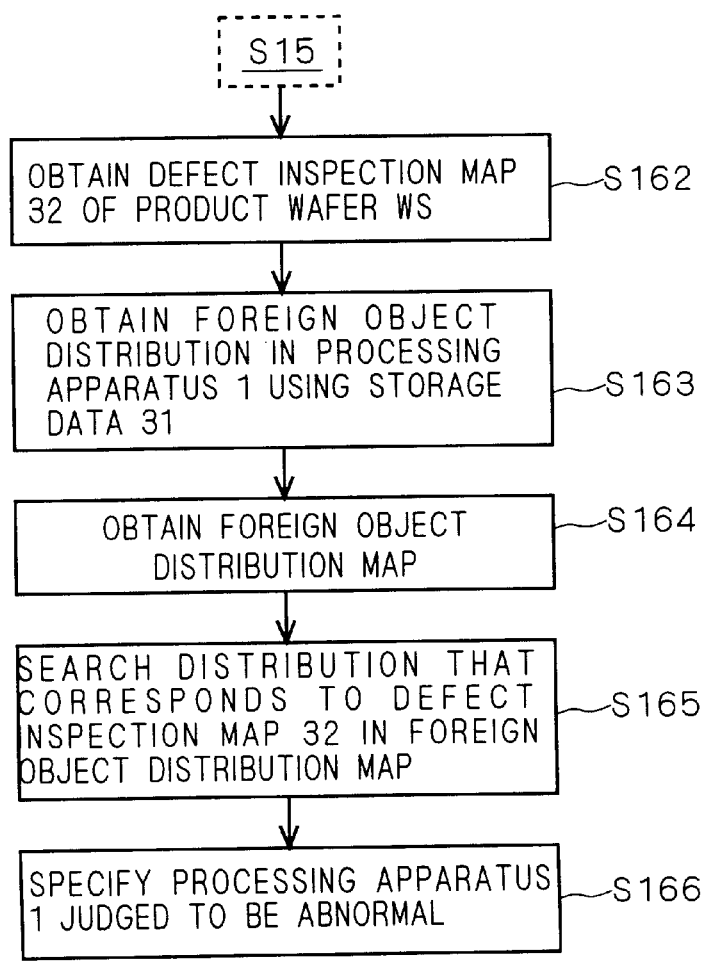
FIG. 13 is a flow chart showing part of steps according to a fourth embodiment of the invention.

FIG. 13 is a flow chart showing part of foreign object analyzing steps according to the present embodiment and exemplifying the details of step S16 explained in the first embodiment.

In step S162, the defect inspection map 32 of the product wafer WS is obtained. Then, in step S163, the storage data 31 is read out from the database 6, thereby acquiring the foreign object distribution of the monitor wafers $W_1$ to $W_N$ in the processing apparatuses $1_1$ to $1_N$ in which the product wafer WS has been processed. In step S164, a foreign object distribution map is obtained, which is exemplified by a defect position map indicating where foreign objects exist that are larger than a predetermined allowable size and a map indicating an increase of foreign objects with time.

Next, in step S165, such a foreign object distribution map as described above that corresponds to the defect inspection map 32 is searched. A processing apparatus 1 having a foreign object distribution map that is hit by the search is specified to be the cause of the defect indicated on the defect inspection map 32 (step S166). For instance, dust may be the cause of occurrence of a defect in the processing apparatus 1.

In the present embodiment, maps are compared as in the third embodiment, which facilitates specifying a processing apparatus 1 that causes a defect with high accuracy.

Fifth Preferred Embodiment

Even in the case that there are a plurality of apparatuses of the same model as described in the first embodiment, the storage data 31 are generated using names of processing apparatuses and groups names to which they belong to as identification names, so that the apparatuses can be distinguished from one another. Therefore, foreign object distributions of these apparatuses can be compared.

Figure 14:
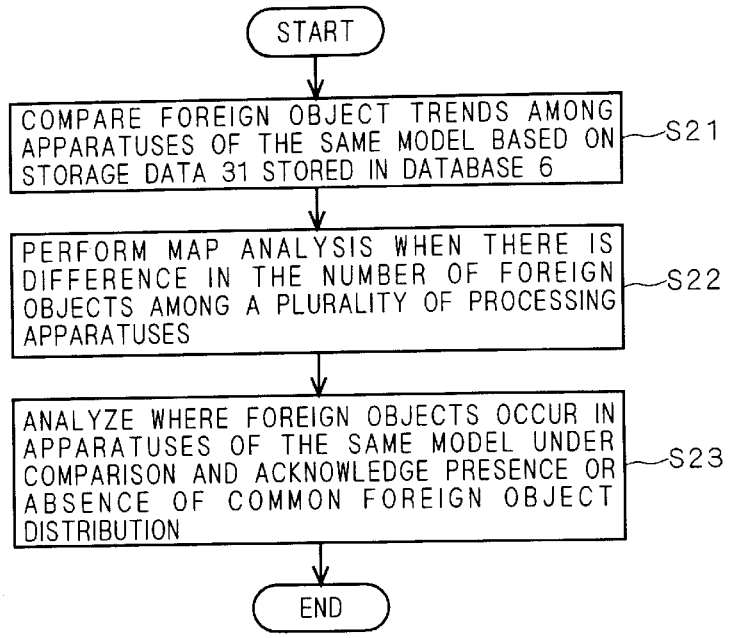
FIG. 14 is a flow chart showing part of steps according to a fifth embodiment of the invention.

FIG. 14 is a flow chart showing part of foreign object analyzing steps according to the present embodiment, which can be realized by the structure shown in FIG. 1 in the first embodiment. In step S21, trends in the number of foreign objects are compared among apparatuses of the same model based on the storage data 31 stored in the database 6.

Figure 15:
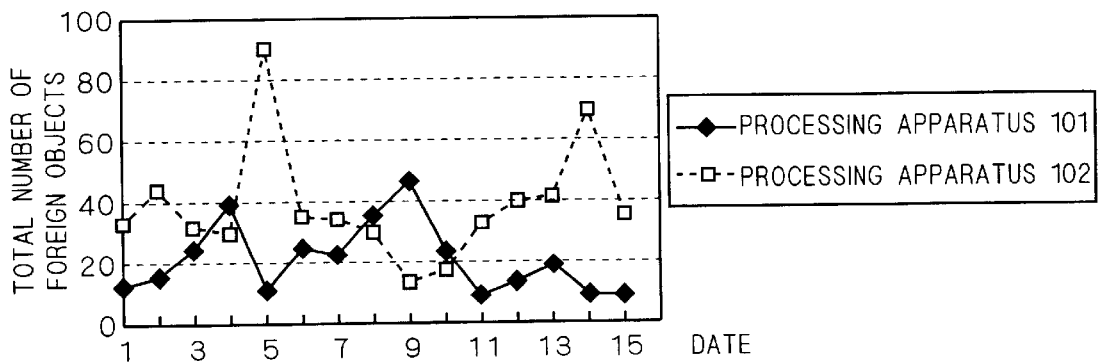
FIG. 15 is a graph exemplifying execution results of the fifth embodiment.

FIG. 15 shows graphs which compares trends in the number of foreign objects in a processing apparatuses 101 and 102 of the same model. It can be seen that there exists a relatively significant difference in the number of foreign objects between the processing apparatuses 101 and 102 on the fifth and fourteenth days.

Figure 16A:
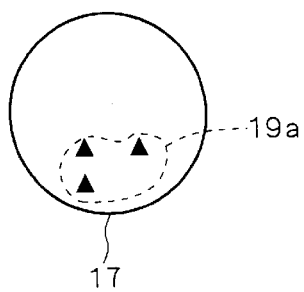
FIGS. 16A and 16B are maps exemplifying execution results of the fifth embodiment.
Figure 16B:
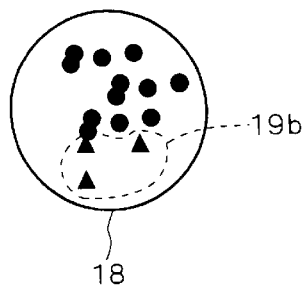

Referring back to FIG. 14, map analysis is carried out in step S22 in the case that there is such a difference in the number of foreign objects that is larger than a predetermined number among a plurality of apparatuses of the same model. Such a predetermined number of foreign objects may be previously stored in the data management system 4. FIGS. 16A and 16B are maps schematically indicating a comparison among foreign object distribution maps of apparatuses of the same model, which show foreign object distribution maps 17 and 18 with respect to the processing apparatuses 101 and 102, respectively. The foreign object distribution map 17 has a distribution pattern 19a (indicated by solidly shaded triangles in the drawing) and the foreign object distribution map 18 also has a distribution pattern 19b (indicated by solidly shaded triangles in the drawing) having commonality with the distribution pattern 19a. There exist foreign objects (indicated by solidly shaded circles) other than the distribution pattern 19b in the foreign object distribution map 18.

The above comparison realizes an analysis such as whether or not the occurrence of foreign objects are common to processing steps performed by apparatuses of the same model under comparison (corresponding to the distribution shown in the above-mentioned distribution pattern 19a), or whether or not the apparatuses of the same model each have a specific cause of the occurrence of foreign objects (corresponding to the distribution except the above-mentioned distribution pattern 19b). For instance, it is possible to easily specify a position where dust is generated in processing apparatuses, which contributes to the solution of the occurrence of dust in the processing apparatuses.

Sixth Preferred Embodiment

A plurality of inspection recipes 3 may be employed in one inspection. For example, by varying the sensitivity in an inspection and the polarizing condition used for the inspection, a plurality of inspection results may be acquired in one inspection.

Figure 17:
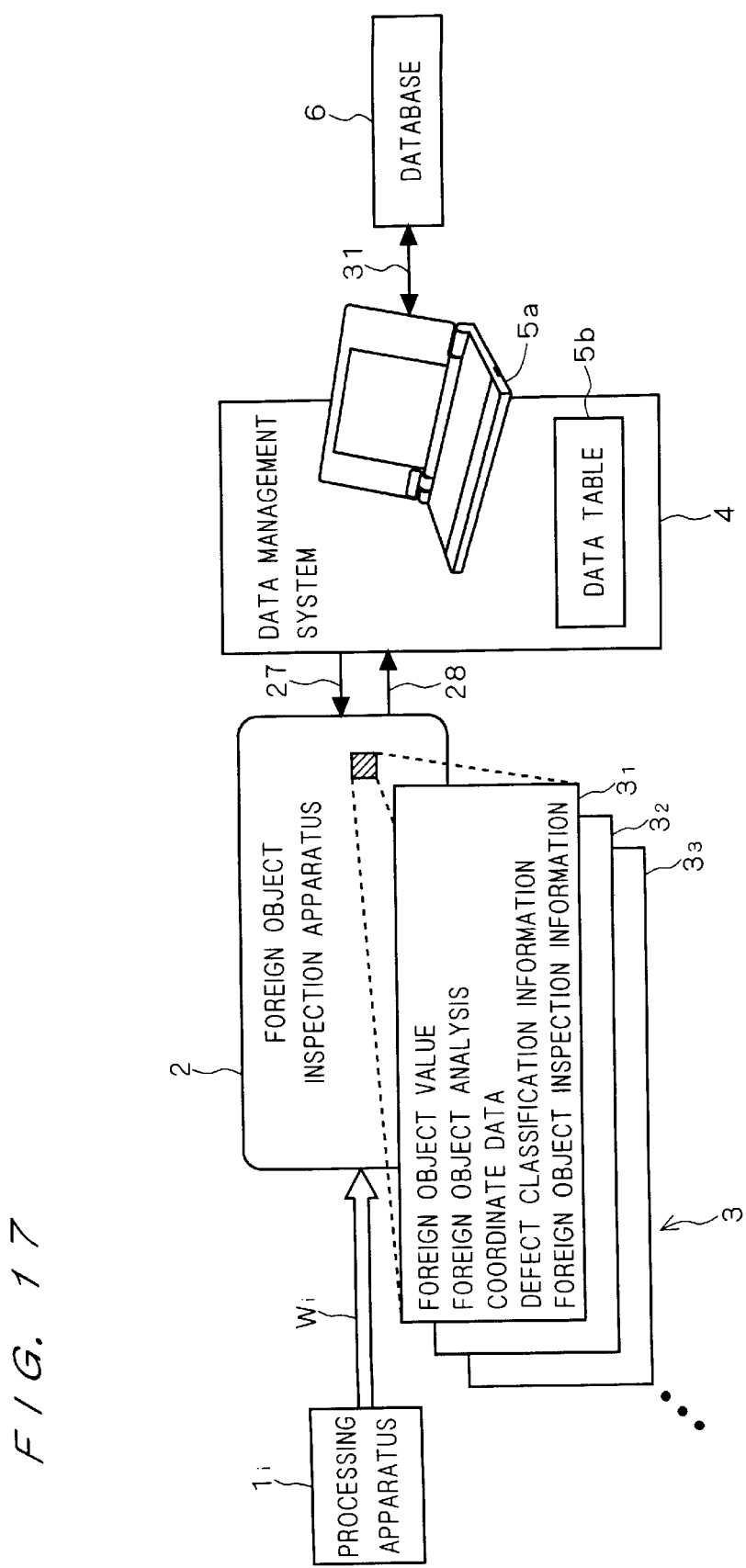
FIG. 17 is a schematic view of a structure according to a sixth embodiment of the invention.

FIG. 17 is a schematic view of a structure used for foreign object analysis according to the present embodiment. It is characteristically different from the structure shown in FIG. 1 in that the inspection recipe 3 comprises a plurality of inspection recipes $3_1, 3_2, 3_3, \ldots$. Although FIG. 8 illustrates a plurality of inspection recipes 3 in the third embodiment, this means that an inspection recipe 3 is provided for each of the processing steps $P_1$ to $P_N$, respectively, from which the present embodiment is different in that the plurality of inspection recipes $3_1, 3_2, 3_3, \ldots$ are provided for each processing step.

The plurality of inspection recipes $3_1, 3_2, 3_3, \ldots$ are previously set in, e.g., the data management system 4, and are different from each other in the sensitivity in an inspection or the polarizing condition employed in the inspection as above described.

Steps proceed in accordance with the flow chart of FIG. 2 similarly to the first embodiment, while one inspection is carried out several times in accordance with the predetermined inspection recipes $3_1, 3_2, 3_3, \ldots$ in the foreign object inspection in step S13.

By executing step S14, inspection results by the plurality of inspection recipes $3_1, 3_2, 3_3, \ldots$ in one monitor wafer $W_i$ are provided for the data management system 4. In step S15, the plurality of inspection recipes $3_1, 3_2, 3_3, \ldots$, each assign the inspection result 28 an identification name that can be distinguished from others such as an identification name including a name for specifying an inspection recipe, thereby providing it for the database 6.

In this way, the condition of generated foreign objects can be acquired at a plurality of sensitivities, for example, which allows to make individual analyses. Therefore, it is possible to optimize the inspection recipe 3 so as to be used for mass-production, which further contributes to settings of specifications corresponding to the inspection recipe 3.

The foreign object inspection apparatus 2 may comprise a plurality of foreign object detectors, and each of the plurality of inspection recipes $3_1, 3_2, 3_3, \ldots$ may indicate the use of a foreign object detector different from one another for the foreign object inspection though it is the same inspection with respect to one foreign object detection.

Seventh Preferred Embodiment

Figure 18:
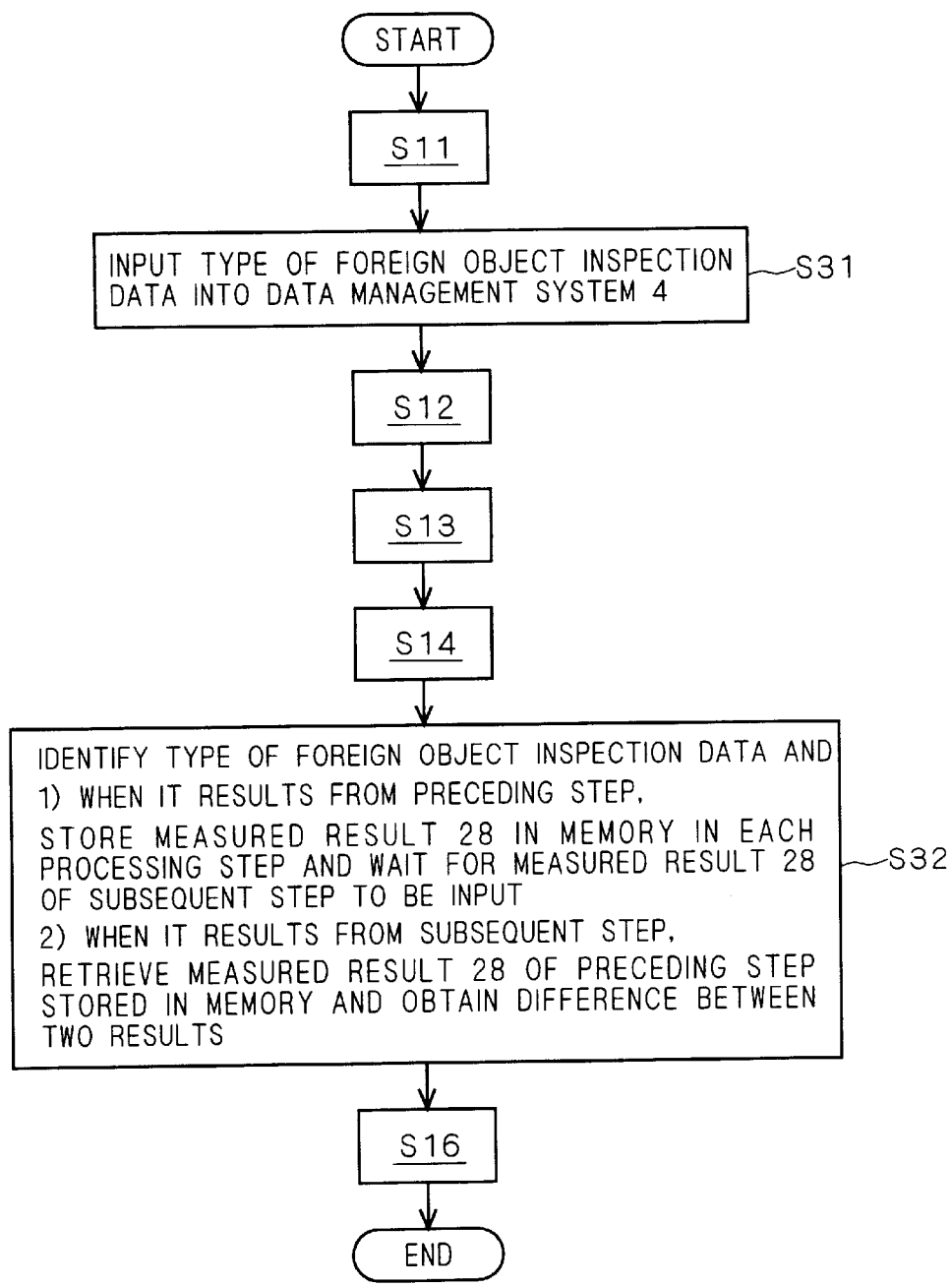
FIG. 18 is a flow chart showing foreign object analyzing steps according to a seventh embodiment of the invention.

Distributions of foreign objects can also be compared among different steps, not only among apparatuses of the same model. FIG. 18 is a flow chart showing foreign object analyzing steps according to the present embodiment. The flow chart can be executed in the structures shown in FIGS. 1 and 8, however, one or more monitor wafers $W_i$ are not used in the present embodiment.

In step S11, an identification name of a processing apparatus is selected, similarly to the first embodiment. Then, proceeding into step S31, the type of foreign object inspection data is input into the data management system 4. Foreign object inspection data can be exemplified by two types: a step preceding to a processing step under consideration (hereinafter briefly referred to as "preceding step"); and a step subsequent to a processing step under consideration (hereinafter briefly referred to as "subsequent step").

Thereafter, in steps S12 and S13, the foreign object inspection apparatus 2 performs foreign object inspection on a wafer which has been arrived at each processing step, similarly to the first embodiment. For instance, a wafer arrived at the processing step $P_i$ has undergone the processing steps $P_1$ to $P_i$, which is hereinafter referred to as a wafer $T_i$. In step S14, the measured result 28 on the wafer $T_i$ is provided for the data management system 4 in each processing step.

In step S32, identification is carried out for the measured result 28 provided for the data management system 4 about what type of foreign object inspection data it has, e.g., citing the above example, whether the measured result 28 results from the preceding step or the subsequent step. For example, when the processing step $P_i$ is under consideration, processing steps $P_1$ to $P_{i-1}$ are all preceding steps and processing steps $P_{i+1}$ to $P_N$ are all subsequent steps.

When the given measured result 28 results from a preceding step, the result is once stored in a memory (not shown) generally provided in the microcomputer $5a$ which forms the data management system 4, for example, while waiting for the measured result 28 of a subsequent step to be input. On the other hand, when the given measured result 28 results from a subsequent step, the measured result 28 resulting from a preceding step stored in the above-noted memory is retrieved and a difference between the two results is obtained. This is realized by overlapping coordinates which are set at performing the foreign object inspection. Therefore, a difference in the number of foreign objects before and after the processing step under consideration can be obtained in step S32, so that an increase in the number of foreign objects before and after the processing step under consideration can be known.

FIGS. 19A and 19B are maps schematically indicating how foreign objects increase, which are a foreign object distribution map 20 in a preceding step and a foreign object distribution map 22 in a subsequent step, respectively. Since foreign objects 21 existing in the foreign object distribution map 20 in the preceding step also exist in the foreign object distribution map 22 in the subsequent step, foreign objects 23 other than the foreign objects 21 can be considered as having been generated between the preceding step and the subsequent step. Thereafter, proceeding into step S16, data on the remainder of foreign objects is stored as the storage data 31.

The preceding step and the subsequent step can be taken as including a plurality of steps, respectively, with respect to the processing step under consideration. For example, when the processing step $P_i$ is under consideration, the inspection result 28 in either of the processing steps $P_1$ to $P_{i-1}$ is considered to be resulting from the preceding step. Therefore, it is possible to know an increase in the number of foreign objects in a single or plural processing steps including the processing step $P_i$ under consideration. This enables to know an increase in the number of foreign objects only in the processing step $P_i$ as well as an increase in the number of foreign objects in an optional number of processing steps before and after the processing step $P_i$. Such optionality allows an operation that corresponds to a predicted level of the quantity of foreign objects in the processing steps.

The same inspection recipe 3 is not necessarily used for the foreign object inspection in a preceding step and a subsequent step, but the plurality of inspection recipes $3_1, 3_2, 3_3, \ldots$ may be employed in the foreign object inspection for the preceding step, for example, as shown in the sixth embodiment. In view of the total number of foreign objects, for instance, the number of foreign objects Z1, Z2, Z3 corresponding to the plurality of inspection recipes $3_1, 3_2, 3_3, \ldots$ in a preceding step may be subtracted from the number of foreign objects Y in a subsequent step. This facilitates a grasp of an increase in the number of foreign objects with more reliability.

Eighth Preferred Embodiment

Not only in apparatuses of the same model but also in one processing apparatus, distributions of foreign objects can be compared before and after processing steps performed by the processing apparatus. FIG. 20 is a flow chart showing part of the foreign object analyzing steps according to the present embodiment, in which step S32 in the seventh embodiment is replaced by step S33.

In step S31, the type of foreign object inspection data is input into the data management system 4, as in the seventh embodiment (FIG. 18). In the present embodiment, two types of foreign object inspection data are provided; data before and after processing steps to be executed by a processing apparatus, i.e., data yet to be processed and data already processed.

The measured result 28 provided for the data management system 4 by step S14 is determined in step S33 whether it is yet to be processed or already processed. If it is determined as data yet to be processed, the measured result 28 is stored in the memory in each processing step, while waiting for the measured result 28 is input after being processed in each processing step. On the other hand, if it is determined as data already processed, the measured result 28 yet to be processed in the same processing step is retrieved, and a difference between the two results is obtained. This is realized by overlapping coordinates which are set at, e.g., inspecting foreign objects in the present embodiment as well.

One or more monitor wafers $W_i$ are used in each processing step, where data yet to be processed and data already processed are compared as described above, so as to achieve a grasp of occurrence of foreign objects in each processing step.

Ninth Preferred Embodiment

Figure 21:
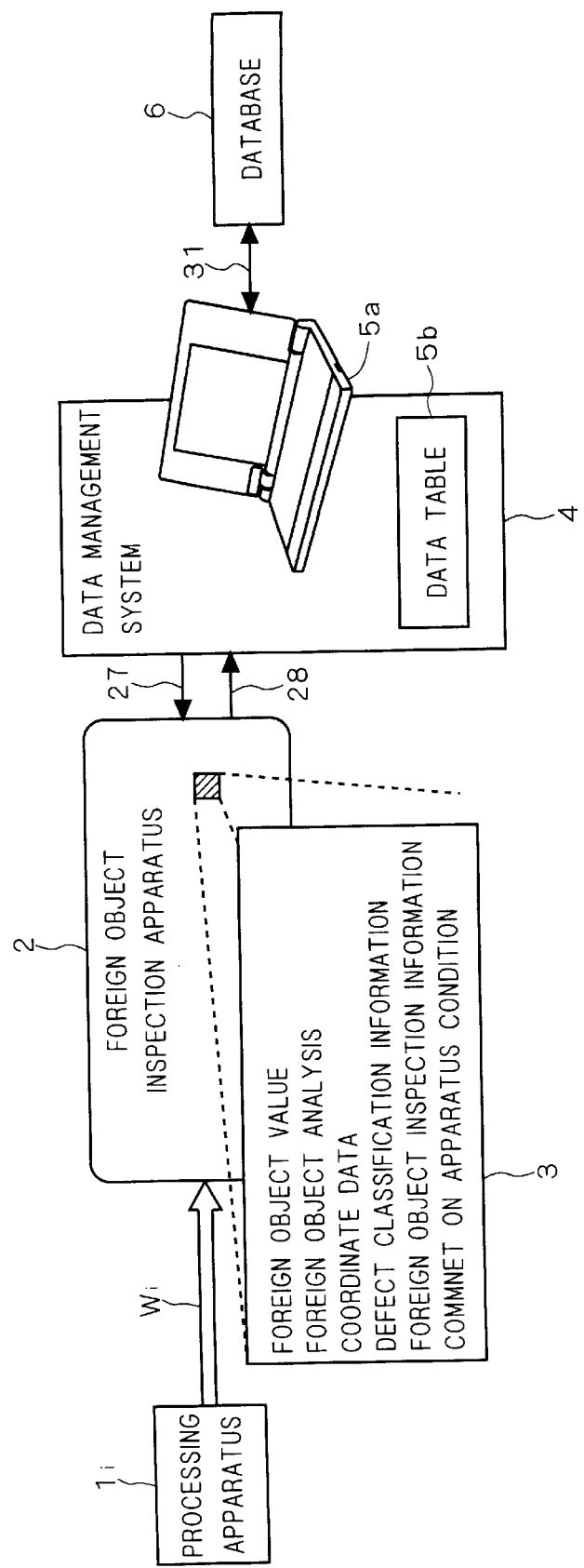
FIG. 21 is a schematic view of a structure according to a ninth embodiment of the invention.
Figure 22:
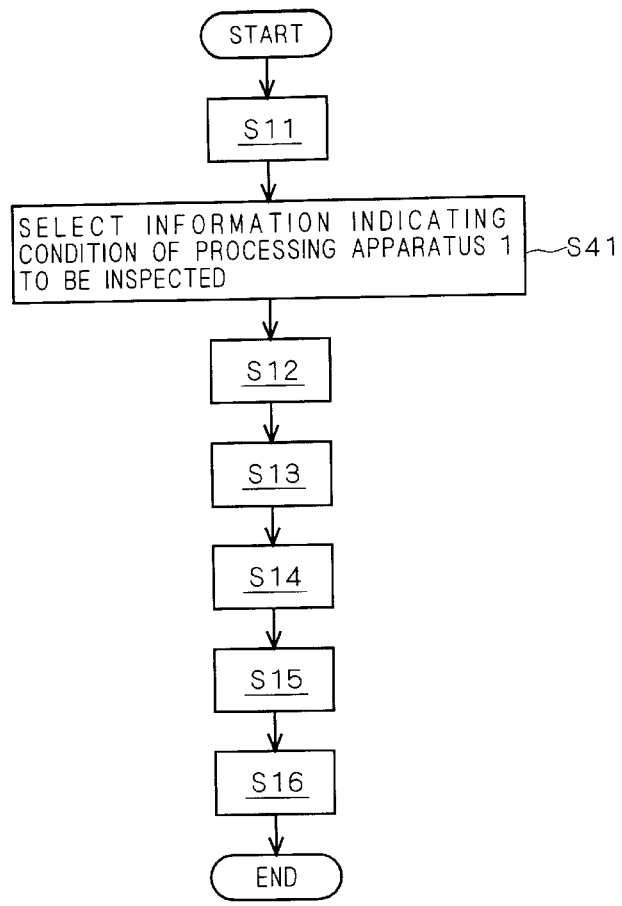
FIG. 22 is a flow chart briefly showing steps of the ninth embodiment.
Figure 23:
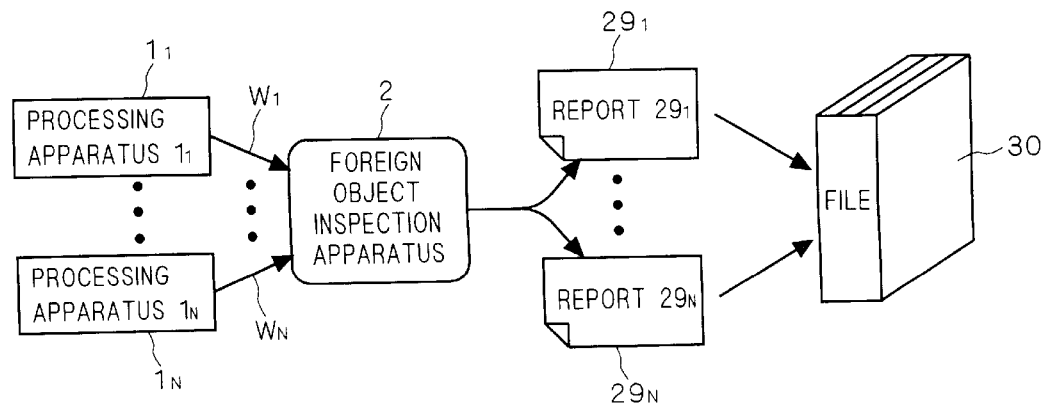
FIG. 23 is a schematic view of conventional foreign object controlling steps.

FIG. 21 is a schematic view of a structure used for foreign object analysis according to the present embodiment. FIG. 22 is a flow chart briefly showing the foreign object analyzing steps.

In the present embodiment, the storage data 31 further includes a comment on the apparatus condition which indicates the condition of a processing apparatus to be inspected. For instance, the comment on the apparatus condition can be added to the inspection recipe 3. Information such as whether a processing apparatus has been undergone routine maintenance, or whether a trouble such as wafer cracking has just occurred, can be listed as the comment on the apparatus condition, and a plurality of candidates can be stored previously in, e.g., the micro computer 5a in the data management system 4.

After selecting an identification name in step S11 as in the first embodiment, step S41 is executed before proceeding into step S12. In step S41, information that indicates the condition of the processing apparatus 1 to be inspected is selected.

Thereafter, steps S12, S13, S14, S15 and S16 are executed as in the first embodiment. In step S14, however, the measured result 28 is assigned not only the identification name of the processing apparatus 1 but also the comment on the apparatus condition, thereby generating the storage data 31, which is provided for the database 6.

The employment of the analyzing steps of the present embodiment contributes to an analysis of the relation between the condition of a processing apparatus and a cause of occurrence of foreign objects due to the processing apparatus, e.g., occurrence of dust. Application to the manufacture of a semiconductor device The analysis described in the above embodiments is made for a processing apparatus to be used for manufacturing a semiconductor device, so that a semiconductor device can be effectively manufactured using the processing apparatus.

While the invention has been shown and described in detail, the foregoing description is in all aspects illustrative and not restrictive. It is therefore understood that numerous modifications and variations can be devised without departing from the scope of the invention.

What is claimed is:

1. An inspection analyzing method comprising the steps of:

(a) providing one or more monitor wafers for each of a plurality of processing steps individually performed by a plurality of processing apparatuses, at least one of said plurality of processing steps being performed by one of a first processing apparatus and a second processing apparatus of said plurality of processing apparatuses to perform a substantially same processing function;

(b) performing an inspection on said one or more monitor wafers to obtain an inspection result; and (c) assigning said inspection result an identification name for identifying each of said plurality of processing apparatuses having performed said plurality of said processing steps in said step (a) on said one or more monitor wafers subjected to said inspection by which said inspection result is obtained, and storing said inspection result.

2. The inspection analyzing method according to claim 1, further comprising the step of (d) compiling and analyzing said inspection result stored in said step (c).

3. The inspection analyzing method according to claim 1, wherein said step (b) includes the step of (b-1) issuing an alarm when said inspection result falls outside a predetermined allowable range.

4. The inspection analyzing method according to claim 3, further comprising the step of (e) comparing said inspection result stored in said step (c) for a processing apparatus among said plurality of processing apparatuses in which an alarm has been issued in said step (b-1) with a defect distribution of a product wafer which has undergone said plurality of processing steps executed by said plurality of processing apparatuses.

5. The inspection analyzing method according to claim 1, further comprising the step of (e) comparing said inspection result stored in said step (c) with a defect distribution of a product wafer which has undergone said plurality of processing steps executed by said plurality of processing apparatuses.

6. The inspection analyzing method according to claim 1, wherein said plurality of processing apparatuses execute the same processing steps.

7. The inspection analyzing method according to claim 1, wherein a plurality of inspection recipes are employed in said step (b) to obtain said inspection result by each of said plurality of inspection recipes.

8. The inspection analyzing method according to claim 1, wherein said step (b) includes the steps of:

(b-1) performing said inspection before and after processes of said plurality of processing steps, respectively; and (b-2) obtaining, as said inspection result, a difference in said inspection performed before and after said processes of said plurality of processing steps, respectively.

9. The inspection analyzing method according to claim 8, wherein in said step (b-2), said inspection result is obtained as a difference between data on said inspection obtained before said processes and that obtained after said processes, considering position coordinates of said one or more monitor wafers.

10. The inspection analyzing method according to claim 1, wherein in said step (c), said inspection result is provided with a comment indicating the condition of a processing apparatus among said plurality of processing apparatuses that corresponds to said inspection result.

11. An inspection analyzing method, comprising the steps of:

(a) performing a plurality of inspections on a wafer processed in a first processing step and a second processing step which is executed after said first processing step, said first and second steps being performed by a plurality of processing apparatuses, the first processing step is executed by one of a first processing apparatus and a second processing apparatus configured to perform a substantially same function;

(b) assigning an inspection result and an identification name that identifies a respective one of said first or second processing apparatus having performed said first processing step on said wafer; and (c) comparing a plurality of inspection results obtained by said first processing step with an inspection result obtained by said second processing step for resolving a predetermined wafer condition to either the first or second processing apparatus.

12. The inspection analyzing method according to claim 11, further comprising the step of (d) compiling and analyzing said inspection results stored in said step (c).

13. The inspection analyzing method according to claim 1, wherein said inspection results stored in said step (c) are converted into a file that corresponds to a browser and transmitted.

14. The inspection analyzing method according to claim 11, wherein said inspection results stored in said step (c) are converted into a file that corresponds to a browser and transmitted.

15. The inspection analyzing method according to claim 1, wherein said inspection results stored in said step (c) can be delivered on a network.

16. The inspection analyzing method according to claim 11, wherein said inspection results stored in said step (c) can be delivered on a network.

* * * * *